US012737654B2

(12) United States Patent
Finck et al.

(10) Patent No.: US 12,737,654 B2
(45) Date of Patent: Sep. 15, 2026

(54) LONG-RANGE COUPLING QUBITS IN QUANTUM COMPUTING WITH ENERGY LOSS PROTECTION VIA MULTI-MODE AND FLUXONIUM QUBITS

(71) Applicant: International Business Machines Corporation, Armonk, NY (US)

(72) Inventors: Aaron Finck, White Plains, NY (US); Sarunya Bangsaruntip, Mount Kisco, NY (US); Cihan Kurter, White Plains, NY (US); John Blair, Katonah, NY (US); George Andrew Keefe, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 204 days.

(21) Appl. No.: 18/056,829

(22) Filed: Nov. 18, 2022

(65) Prior Publication Data

US 2024/0169232 A1 May 23, 2024

(51) Int. Cl.

| | |
|---|---|
| ***G06N 5/04*** | (2023.01) |
| ***G06N 10/20*** | (2022.01) |
| ***G06N 10/40*** | (2022.01) |
| ***H03K 17/92*** | (2006.01) |

(52) U.S. Cl.

CPC ............. *G06N 10/20* (2022.01); *G06N 10/40* (2022.01); *H03K 17/92* (2013.01)

(58) Field of Classification Search

CPC ...................................................... G06N 10/20

See application file for complete search history.

(56) References Cited

U.S. PATENT DOCUMENTS

| | | | |
|---|---|---|---|
| 9,495,644 | B2 | 11/2016 | Chudak et al. |
| 10,268,622 | B2 | 4/2019 | Hilton et al. |
| 10,353,844 | B2 | 7/2019 | Naaman et al. |

(Continued)

FOREIGN PATENT DOCUMENTS

| | | | |
|---|---|---|---|
| WO | 2019126396 | A1 | 6/2019 |

OTHER PUBLICATIONS

Goto. "Double-transmon coupler: fast two-qubit gate with no residual coupling for highly detuned superconducting qubits." Physical review applied 18, 034038 (2022). (Year: 2022).*

(Continued)

*Primary Examiner* — Paul A Wartalowicz

(74) *Attorney, Agent, or Firm* — Amin, Turocy & Watson, LLP

(57) ABSTRACT

One or more systems, devices, or methods of use provided herein relate to a process of long-range coupling qubits in a quantum computing device with energy loss protection. A system can comprise a first transmon coupler capable of selectively coupling a first tunable coupler qubit to a first fluxonium qubit; a second transmon coupler capable of selectively coupling a second tunable coupler qubit to a second fluxonium qubit. Additionally, in one or more embodiments, the system can include a long-range coupler capable of selectively coupling the first fluxonium qubit to the second fluxonium qubit. The first transmon coupler can (Continued)

be coupled to a first B mode of the first tunable coupler qubit, and the second transmon coupler can be coupled to a second B mode of the second tunable coupler qubit.

20 Claims, 9 Drawing Sheets

(56) References Cited

U.S. PATENT DOCUMENTS

| | | | | |
|---|---|---|---|---|
| 10,832,156 | B2 | 11/2020 | Chen et al. | |
| 11,188,843 | B2 | 11/2021 | Barzegar et al. | |
| 11,658,860 | B2 * | 5/2023 | Calabro | H04L 27/3411 375/295 |
| 2019/0220771 | A1 | 7/2019 | Boothby et al. | |
| 2020/0320426 | A1 | 10/2020 | Amin et al. | |
| 2022/0140223 | A1 * | 5/2022 | Gao | H10N 60/12 438/2 |
| 2022/0374755 | A1 * | 11/2022 | Didier | G06N 10/20 |
| 2023/0180631 | A1 * | 6/2023 | Finck | G06N 10/20 327/366 |

OTHER PUBLICATIONS

Zhang et al. "A scalable superconducting quantum simulator with long-range connectivity based on a photonic bandgap metamaterial." Science 379 p. 278-283 (2023). (Year: 2023).*

Chang, et al., "Remote Entanglement via Adiabatic Passage Using a Tunably Dissipative Quantum Communication System", Phys Rev Lett 124, 240502 (2020). https://arxiv.org/abs/2005.12334.

Finck, et al., "Multi-Mode Couplers for Enhanced Connectivity," U.S. Appl. No. 17/930,941, filed Sep. 9, 2022.

Finck, et al., "Multimode Coupler To Control Interaction Between Quantum Bits," U.S. Appl. No. 17/848,903, filed Jun. 24, 2022.

Finck, et al., "Controlling Interaction Between Coupled Superconducting Quantum Bits," U.S. Appl. No. 17/836,268, filed Jun. 9, 2022.

Finck, "Quantum Entangling Gate Between Multi-Mode Qubits," U.S. Appl. No. 17/541,364, filed Dec. 3, 2021.

Nesterov, et al., "Controlled-NOT gates for fluxonium qubits via selective darkening of transitions," arXiv:2202.04583v1 [quant-ph] Feb. 9, 2022.

* cited by examiner

COMPUTER 801

PROCESSOR SET 810

PROCESSING CIRCUITRY 820

CACHE 821

COMMUNICATION FABRIC 811

VOLATILE MEMORY 812

PERSISTENT STORAGE 813

OPERATING SYSTEM 822

900

PERIPHERAL DEVICE SET 814

UI DEVICE SET 823

STORAGE 824

IoT SENSOR SET 825

NETWORK MODULE 815

END USER DEVICE 803

WAN 802

REMOTE SERVER 804

REMOTE DATABASE 830

PRIVATE CLOUD 806

GATEWAY 840

PUBLIC CLOUD 805

CLOUD ORCHESTRATION MODULE 841

HOST PHYSICAL MACHINE SET 842

VIRTUAL MACHINE SET 843

CONTAINER SET 844

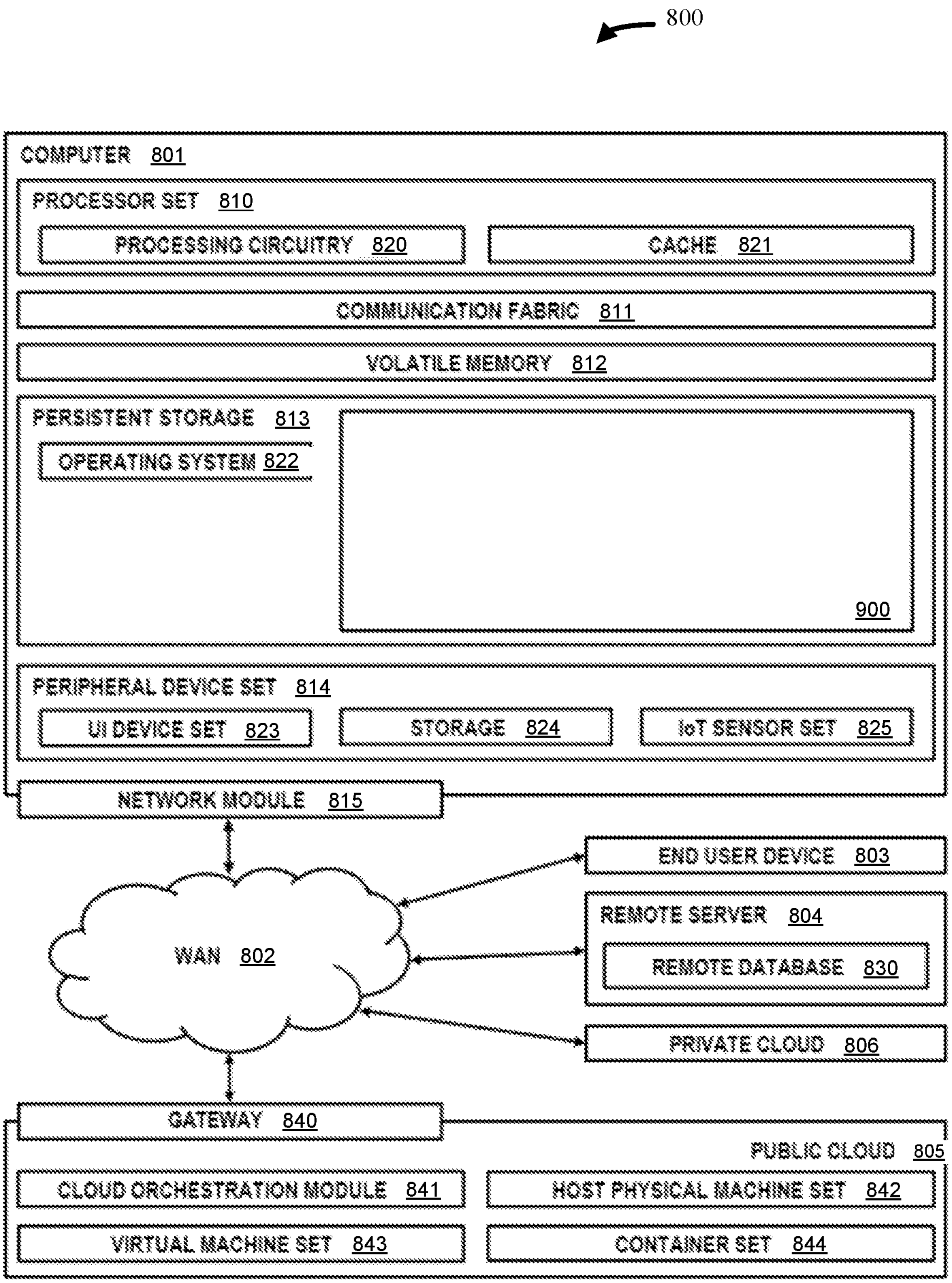

FIG. 8

LONG-RANGE COUPLING QUBITS IN QUANTUM COMPUTING WITH ENERGY LOSS PROTECTION VIA MULTI-MODE AND FLUXONIUM QUBITS

BACKGROUND

The present disclosure relates to long-range coupling qubits in quantum computing, and more specifically, to a quantum device for long-range coupling multi-mode qubits and fluxonium qubits with energy loss protection. Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

On a large scale, quantum computing cloud service providers can execute millions of quantum jobs for users during a year. Each quantum job can include the execution of one or more quantum programs at a physical logic circuit. Physical, real-world, quantum logic circuits controlled by a quantum system can include a plurality of qubits. Coupling qubits to each other or to the environment often results in various unwanted interactions. Such qubits can be evaluated in terms of quality and quantity. For example, such metrics can include qubit coherence time and the gate operator fidelity.

One or more embodiments described herein relate generally to a quantum device, and more specifically, to a quantum device facilitating long-range coupling qubits with energy loss protection. Embodiments relate to long-range coupling using transmon couplers and selective coupling to facilitate energy loss protection for the quantum device.

SUMMARY

The following presents a summary to provide a basic understanding of one or more embodiments described herein. This summary is not intended to identify key or critical elements, or delineate any scope of the particular embodiments or any scope of the claims. The sole purpose of the summary is to present concepts in a simplified form as a prelude to the more detailed description that is presented later. In one or more embodiments described herein, systems, devices, and/or methods that facilitate error mitigation for quantum computing are described.

According to an embodiment, a system can comprise a first transmon coupler capable of selectively coupling a first tunable coupler qubit to a first fluxonium qubit and a second transmon coupler capable of selectively coupling a second tunable coupler qubit to a second fluxonium qubit. Further, the system can include a long-range coupler capable of selectively coupling the first fluxonium qubit to the second fluxonium qubit.

According to another embodiment, a method of performing operations across a long-range qubits coupling device with energy loss protection can comprise providing a device including a first transmon coupler that can be in selective electrical connection between a first fluxonium qubit and a first tunable coupler qubit; a second transmon coupler that can be in selective electrical connection between a second fluxonium qubit and a second tunable coupler qubit; and a long-range coupler that can be in selective electrical connection with the first fluxonium qubit and the second fluxonium qubit. Additionally, the method of performing operations can comprise operating the device in a first state to transmit information between the first tunable coupler qubit and the first fluxonium qubit, and to transmit information between the second tunable coupler qubit and the second fluxonium qubit. Further, the method of performing operations can comprise operating the device in a second state to transmit information between the long-range coupler, the first fluxonium qubit, and the second fluxonium qubit.

According to yet another embodiment, a device can comprise a first fluxonium qubit that can be coupled to a first tunable coupler qubit by a first transmon coupler; a second fluxonium qubit that can be coupled to a second tunable coupler qubit by a second transmon coupler; and a long-range coupler that can be coupled to the first fluxonium qubit and the second fluxonium qubit. Additionally, the first tunable coupler qubit can include a first B mode and the second tunable coupler qubit can include a second B mode. Further, the first B mode of the first tunable coupler qubit and the second B mode of the second tunable coupler qubit can be coupled to the first transmon coupler and the second transmon coupler.

DESCRIPTION OF THE DRAWINGS

FIG. 8 illustrates a block diagram of an example, non-limiting operating environment in which one or more embodiments described herein can be facilitated.

DETAILED DESCRIPTION

Figure 1:
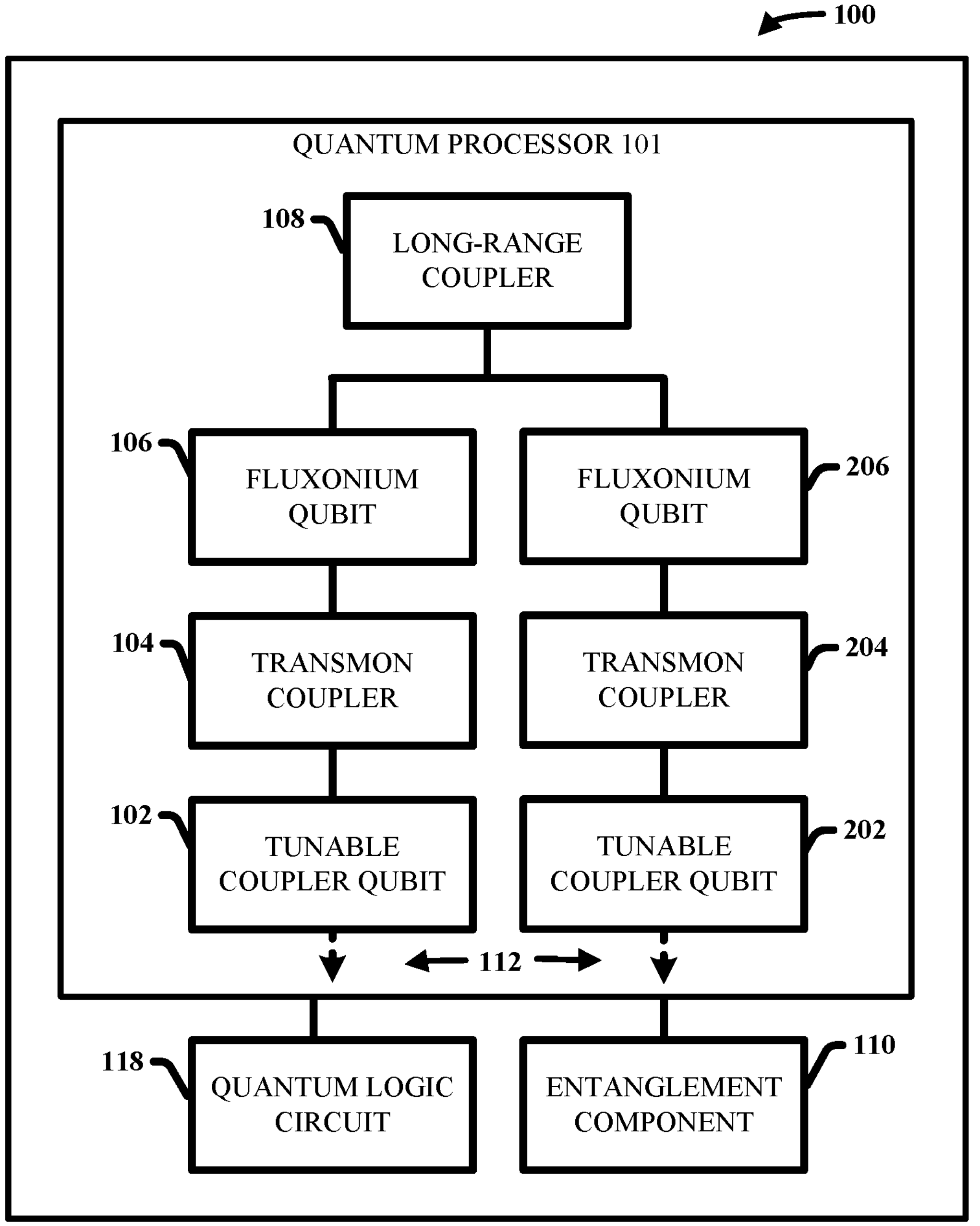
FIG. 1 illustrates a block diagram of an example, non-limiting system that can facilitate long-range coupling qubits in a quantum computing device with energy loss protection, in accordance with one or more embodiments described herein.

The following detailed description is merely illustrative and is not intended to limit embodiments or application or uses of embodiments. Furthermore, there is no intention to be bound by any expressed or implied information presented in the preceding Background or Summary sections, or in this Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As used herein, a quantum circuit can be a set of operations, such as gates, performed on a set of real-world physical qubits with the purpose of obtaining one or more qubit measurements. A quantum processor can comprise the one or more real-world physical qubits.

Qubit states only can exist (or can only be coherent) for a limited amount of time. Thus, an objective of operation of a quantum logic circuit (e.g., including one or more qubits) can be to maximize the coherence time of the employed qubits. Longer coherence times can result in additional time for the quantum logic circuit to perform quantum logic operations (e.g., resulting in more complex quantum logic operations). This can be due to the available coherence time of the one or more qubits prior to decoherence of the one or more qubits. For example, a qubit state can be lost in less than 100 to 200 microseconds in one or more cases.

Operation of the quantum circuit can be performed by one or more physical pulses and/or other waveforms, signals and/or frequencies, such as by a waveform generator (or shifting component), to alter one or more states of one or more of the physical qubits. The altered states can be measured, thus allowing for one or more computations to be performed regarding the qubits and/or the respective altered states. Operations on qubits generally can introduce some error, such as some level of decoherence and/or some level of quantum noise, further affecting qubit reliability. Quantum noise can refer to noise attributable to the discrete and/or probabilistic natures of quantum interactions.

A two-level system (TLS), among other noise causes, can comprise a source of noise that can cause deterioration of coherence parameters of one or more qubits of a quantum logic circuit. The noise can couple to a low-energy thermal fluctuator, for example, and can randomly change energy of the noise in the vicinity of a qubit frequency. The qubit frequency is the resonance frequency of a qubit energy transition between two states such as, but not limited to, the ground and first excited states of the qubit. The vicinity of a qubit frequency is a frequency range which in some embodiments can range from about 10 megahertz (MHz) below the qubit frequency to about 10 MHz above the qubit frequency. In other embodiments, the vicinity of a qubit frequency can range from about 100 MHz below the qubit frequency to about 100 MHz above the qubit frequency. In still other embodiments, the vicinity of a qubit frequency can range from about 1 gigahertz (GHz) below the qubit frequency to about 1 GHz above the qubit frequency. Without being limited to theory, it is believed that such two-level systems can be caused by atomic scale defects in surface oxides on the metals and/or on the silicon of a physical real-world qubit and can be electromagnetically active. Indeed, a qubit, such as a transmon itself is a resonator with an electromagnetic excitation, and thus a qubit excitation can couple with a two-level system (TLS) and can cause performance issues for a quantum logic circuit, such as, but not limited to, deterioration of qubit parameters.

Due to presence of two-level systems in/at the quantum system and/or due to maintenance and/or diagnostics to be performed relative to coherence times of a particular qubit, one or more qubits, such as superconducting qubits, can be unavailable and/or not recommended for use with the quantum logic circuit, even if desired for use. Furthermore, absent understanding of such two-level systems and their associated fluctuations relative to the frequency domain of one or more qubits of a quantum system, coherence of the qubit can be affected. Loss of coherence can cause failure of execution of a quantum circuit, thus wasting power, time, queue space and/or memory relative to a queue of jobs to be performed on a respective quantum system.

There can be varying causes for loss of qubit coherence. Some causes of decoherence can be equipment related. When coherence of a qubit suddenly changes, or changes gradually over time, one or more existing solutions can comprise not employing the qubit until the coherence deterioration is reduced or ends altogether, such as compared to historical coherence parameters for the particular qubit. Absent understanding, such as definitive understanding, that the change in qubit coherence parameters is caused by a two-level system, unnecessary diagnostics and/or maintenance can be performed, such as switching out cables, swapping control electronics, warming up a super-cooled refrigeration system of the quantum system to troubleshoot components, and/or the like. Also, even when a TLS is suspected as a culprit of noise issues, existing techniques for analyzing the frequency space about a qubit's unperturbed frequency, can be cumbersome, timely, resource intensive, and/or manually intensive relative to at least the scheduling and operation of associated diagnostics. The unperturbed frequency of the qubit is the resonance frequency of the qubit as fabricated, in the absence of external effects that may shift its frequency, including but not limited to magnetic flux bias, DC electric field, mechanical strain, and/or an Autler-Townes (AT) effect.

In view of unintended or unforeseen noise/decoherence, waste of quantum resources, time, power, and/or labor can occur. Indeed, because quantum processors and quantum systems are scarce and costly resources, such waste can be detrimental to both users and administrators of quantum systems. Put another way, each quantum processor can have a fixed number of qubits it supports. When quantum circuits cannot use the full capacity of a quantum processor, one or more qubits can remain idle. Thus, it can be desired to facilitate a process for generating a sparse error model of noise associated with quantum gates, employing the sparse error model and drawing samples from the inverse noise model, and inserting the samples to mitigate errors associated with the quantum gates.

Moreover, different quantum circuits can require varying resources. For example, one quantum circuit can use different physical qubits of a quantum logic circuit of a respective quantum system than another quantum circuit. During scheduling of quantum jobs from a queue and corresponding mapping of quantum circuits to a quantum logic circuit, particular qubits can be desirable for use with one quantum circuit as compared to other qubits of a same quantum logic circuit. Quantum noise, such as two-level systems can therefore interfere, often unknowingly, with this mapping. Therefore, device designs that can mitigate errors of the quantum system can be desirable.

To address the aforementioned presence of two-level systems, lack of information regarding qubit coherence parameters, and/or diagnostics/maintenance to address noise, described herein are one or more embodiments of a system, device, and/or method that can mitigate errors associated with one or more quantum gates.

By employing the one or more embodiments described herein, the understanding can further facilitate informed use of the qubit, informed diagnostics of the qubit, and moreover, informed diagnostics/maintenance/calibration/setup of the quantum processor comprising the qubit. This can include optimization of mapping of a quantum circuit, queuing of quantum jobs, and/or general use of a particular qubit of a quantum processor. Indeed, such understanding can be gained, such as separately on a qubit-by-qubit basis, to gain an understanding regarding frequency space about a group of qubits of a quantum processor or other quantum device.

Generally, most quantum applications combine classical computing with the execution of one or more sets of quantum circuits on the quantum processor. Each circuit execution can roughly be thought of as consisting of three phases: (1) initialization of the quantum processor to the $|0>$ ground state; (2) application of the gates that make up the quantum circuit; and (3) measurement of the qubits of interest. For each circuit, this process can be repeated multiple times to obtain the desired measurement statistics. The process of running a quantum circuit is affected by different sources of noise. To that end, minimizing noise/interference in large quantum circuits has been a major challenge.

Due to improvements in quantum hardware and control systems, quantum processors are able to provide more qubits with longer coherence times and better gate fidelities. However, despite these improvements, the levels of noise in current quantum processors still limit the depth of quantum circuits and reduce the accuracy of measured observables. Coupling qubits to each other or to the environment often results in various unwanted interactions and interferences. A challenge of current quantum circuits and systems can involve how to maintain or improve gate performance with growing numbers of parallel controlled qubits along with the practical implications of quantum processors. Further scaling of quantum processors and the development of distributed quantum architectures will likely benefit from efficient long-range coupling of qubits (e.g., resulting in improved scalability and performance).

Given these problems, an architecture can be engineered to suppress unwanted interactions by harnessing quantum interference between different quantum components. Further, one or more embodiments described herein can be implemented to produce a solution to one or more of these problems in the form of systems, devices, and/or methods that can facilitate the following processes: a) coupling a first fluxonium qubit to a first tunable coupler qubit via a first transmon coupler, b) coupling a second fluxonium qubit to a second tunable coupler qubit via a second transmon coupler, and c) coupling the first fluxonium qubit to the second fluxonium qubit via a long-range coupler. Further, the system/method can include selectively coupling the first transmon coupler to a B mode of the first tunable coupler qubit and to a plasmon mode of the first fluxonium qubit; and selectively coupling the second transmon coupler to a B mode of the second tunable coupler and to a plasmon mode of the second fluxonium qubit.

Additionally, the system/method can include inductively coupling the first fluxonium qubit and the second fluxonium qubit to the long-range coupler. Further, the long-range coupler can be selectively coupled to a fluxon mode of the first fluxonium qubit and the second fluxonium qubit. The A mode of the first tunable coupler qubit associated with the first fluxonium qubit can be coupled with one or more other fluxonium qubits (e.g., via the long-rage coupler). Performance degradation due to long-range coupling of qubits can be mitigated by the proposed circuit structure and associated method. That is, embodiments described herein include one or more systems, devices, and/or methods that can facilitate one or more of the aforementioned processes.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 2:
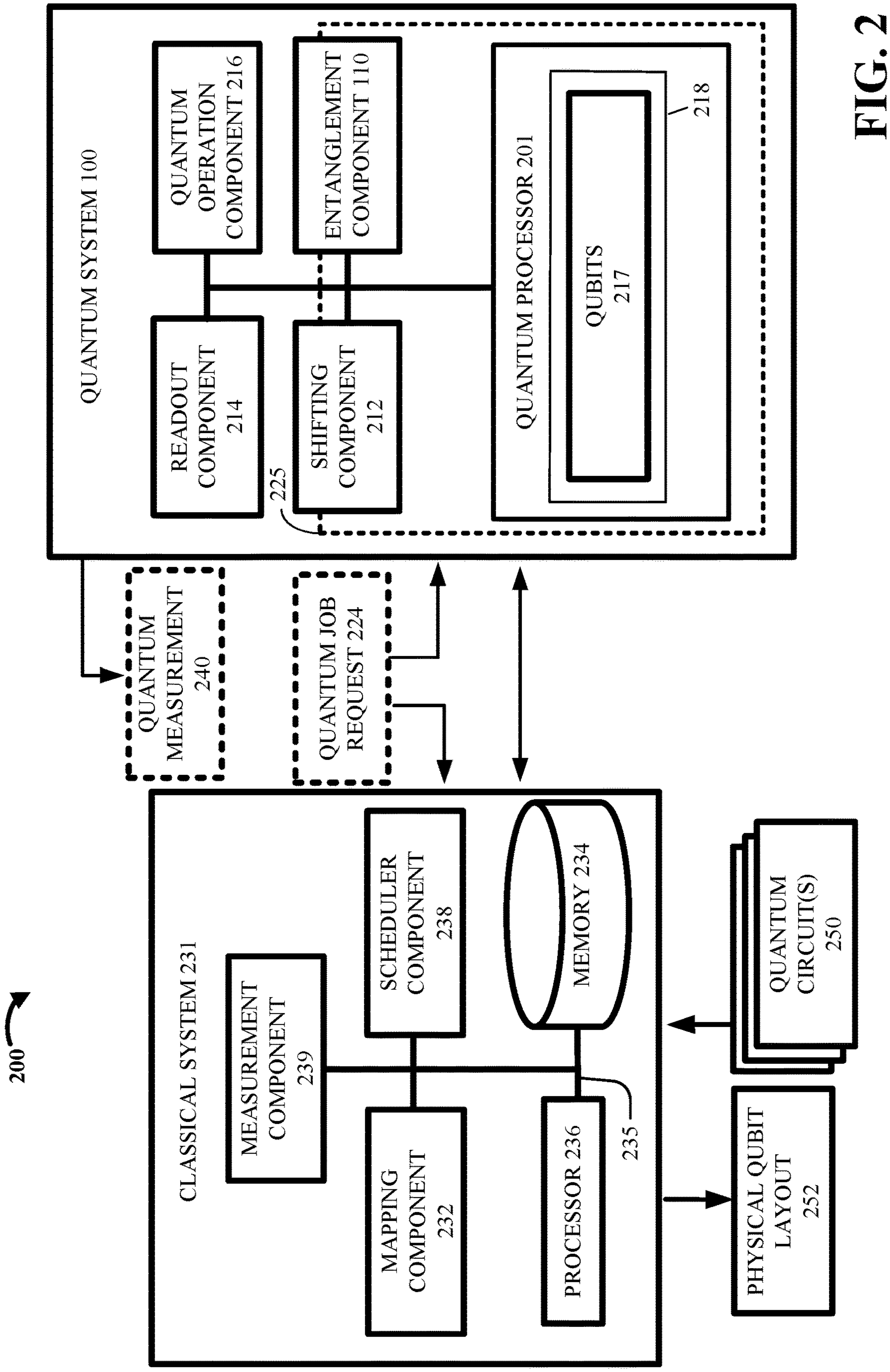
FIG. 2 illustrates a block diagram of an example, non-limiting system that can facilitate long-range coupling qubits in a quantum computing device with energy loss protection, in accordance with one or more embodiments described herein.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting systems 100 as illustrated at FIGS. 1 and 2, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIGS. 1 and/or 2 and/or with other figures described herein.

Turning first generally to FIG. 1, one or more embodiments described herein can include one or more devices, systems and/or apparatuses that fan facilitate long-range coupling qubits in a quantum computing device with energy loss protection. For example, FIG. 1 illustrates a block diagram of an example, non-limiting system 100 that comprises a quantum processor 101 including tunable coupler qubits 102/202, transmon couplers 104/204, fluxonium qubits 106/206, and a long-range coupler 108. The long-range qubit coupling system 100 can protect qubits from losses caused by the long-range busses/couplers. Further, the long-range qubit coupling system 100 can permit the creation of a quantum computer with low cross-talk interference between the qubits, and as such, can assist in creation of a scalable quantum computer. The system 100 can facilitate driving the transmon couplers 104/204 near resonance to entangle the tunable coupler qubits 102/202 (e.g., the A modes) with the fluxonium qubits 106/206 (e.g., the fluxon modes), via an entanglement component 110. Repetitive description of like elements employed in other embodiments described herein is omitted for sake of brevity. Aspects of systems (e.g., the long-range qubit coupling system 100 and the like), apparatuses or processes in various embodiments of the present invention can constitute one or more machine-executable components embodied within one or more machines (e.g., embodied in one or more computer readable mediums (or media) associated with one or more machines). Such components, when executed by the one or more machines (e.g., computers, computing devices, virtual machines, a combination thereof, and/or the like) can cause the machines to perform the operations described.

It should be appreciated that the embodiments depicted in various figures disclosed herein are for illustration only, and as such, the architecture of embodiments is not limited to the systems, devices and/or components depicted therein, nor to any particular order, connection and/or coupling of systems, devices and/or components depicted therein. For example, in some embodiments, the long-range qubit coupling system 100 can further comprise various computer and/or computing-based elements described herein with reference to computing environment 800 and FIG. 8. In several embodiments, computer and/or computing-based elements can be used in connection with implementing one or more of the systems, devices, components and/or computer-implemented operations shown and described in connection with FIG. 1 or with other figures disclosed herein.

Turning next to FIG. 2, the figure illustrates a diagram of an example, non-limiting system 200 that can facilitate long-range coupling via multi-mode qubits and fluxonium qubits with energy loss protection. For example, FIG. 2 illustrates a block diagram of an example, non-limiting system 200 that can employ a shifting component 212 to affect a qubit 217, and a readout component 214 that can be employed to measure one or more characteristics of the affected qubit 217.

Repetitive description of like elements and/or processes employed in respective embodiments is omitted for sake of brevity. As indicated previously, description relative to an embodiment of FIG. 1 can be applicable to an embodiment of FIG. 2. Likewise, description relative to an embodiment of FIG. 2 can be applicable to an embodiment of FIG. 1.

In one or more embodiments, the non-limiting system 200 can be a hybrid system and thus can include both a quantum system and a classical system, such as a quantum long-range qubit coupling system 100 and a classical-based system 231 (also herein referred to as a classical system 231). In one or more other embodiments, the quantum long-range qubit coupling system 100 can be separate from, but function in combination with, the classical system 231. In one or more embodiments, one or more components of the quantum long-range qubit coupling system 100, such as the readout component 214, can be at least partially comprised by the classical system 231, or otherwise comprised external to the quantum long-range qubit coupling system 100. In one or more embodiments, one or more components of the classical system 231, such as the mapping component 232, the scheduler component 238 or the measurement component 239 can be at least partially comprised by the quantum long-range qubit coupling system 100, or otherwise comprised external to the classical system 231.

One or more communications between one or more components of the non-limiting system 200 can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Turning first to the quantum long-range qubit coupling system 100, generally based on a quantum job request 224, on physical qubit layouts 252, and/or on an associated queue of quantum circuits 250 to be executed, the quantum operation component 216 can be a classical processor/memory that stores commands which can be used to operate the various signaling components (of the quantum system 100.

Generally, the quantum long-range qubit coupling system 100 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 240, can be responsive to the quantum job request 224 and associated input data and can be based at least in part on the input data, quantum functions and/or quantum computations.

In one or more embodiments, the quantum long-range qubit coupling system 100 can comprise components, such as an entanglement component 110 (e.g., which can be a processor/memory to facilitate generating entanglement between two superconducting qubits via a tunable coupler that can alternatively be facilitated by one or more other processor or memory of the quantum long-range qubit coupling system 100), a quantum operation component 216, a quantum processor 201, shifting component 212 (e.g., a waveform generator) and/or a readout component 214. In other embodiments, the readout component 214 can be comprised at least partially by the classical system 231 and/or be external to the quantum long-range qubit coupling system 100. The quantum processor 201 can comprise the quantum logic circuit 218 comprising one or more, such as plural, qubits 217. Qubits 217, for example, can be fixed frequency and/or single junction qubits, such as transmon qubits.

The quantum logic circuit 218 and a portion or all of the shifting component 212 can be contained in a cryogenic environment, such as generated by a cryogenic chamber 225, such as a dilution refrigerator. A signal can be generated by the shifting component 212 within the cryogenic chamber 225 to affect one or more of the plurality of qubits 217. Where the plurality of qubits 217 are superconducting qubits, cryogenic temperatures, such as about 4 k or lower can be employed to facilitate function of these physical qubits. Accordingly, one or more elements of the readout component 214 also can be constructed to perform at such cryogenic temperatures.

The quantum processor 201 can be any suitable processor. The quantum processor 201 can generate one or more instructions for controlling the one or more processes of the quantum operation component 216 and/or for controlling the quantum logic circuit 218.

The quantum operation component 216 can obtain (e.g., download, receive, search for and/or the like) a quantum job request 224 requesting execution of one or more quantum programs 250 and/or a physical qubit layout 252 generated by the classical system 231. The quantum job request 224 can be provided in any suitable format, such as a text format, binary format and/or another suitable format. In one or more embodiments, the quantum job request 224 can be received by a component other than of the quantum long-range qubit coupling system 100, such as a by a component of the classical system 231.

The quantum operation component 216 can determine one or more quantum logic circuits, such as the quantum logic circuit 218, for executing a quantum program. In one or more embodiments, the quantum operation component 216/quantum processor 201 can direct the shifting component 212 to generate one or more pulses, tones, waveforms and/or the like to affect one or more qubits 217.

The shifting component 212 can generally perform one or more quantum processes, calculations and/or measurements for shifting the frequency of one or more qubits 217, such as when in respective excited states. For example, the shifting component 212 can operate one or more qubit effectors, such as qubit oscillators, harmonic oscillators, pulse generators and/or the like to cause one or more pulses to stimulate and/or manipulate the state(s) of the one or more qubits 217 comprised by the quantum long-range qubit coupling system 100, and thus can be and/or comprise a waveform generator. In one or more other embodiments, additionally and/or alternatively, the shifting component 212 can facilitate application of flux bias/flux tuning to one or more qubits. This shifting can be employed, as described above, relative to probing of frequency space about the qubit frequency of the qubit, to thereby facilitate measurement of one or more qubit parameters at the shifted frequency.

The readout component 214 can facilitate transmission, e.g., readout, of one or more readings, signals and/or the like to the classical system, such as to the measurement component 239. Further, the readout component 214 can be employed to measure one or more characteristics of the affected qubit 217 (e.g., before and/or after being affected by the shifting component 212 and/or other components of the system 100). The readout component 214 can facilitate amplification and filtering to generate a viable readout of the one or more qubits 217 (e.g., that can be used to evaluate the system 100). From the readout, the measurement component 239 can determine one or more energy relaxation measurements at the qubit frequency or at a shifted frequency of the qubit.

Generally, the operations can allow for better understanding and/or planning of the quantum job queue, qubit decay and/or qubit coherence relative to the quantum logic circuit 218. As indicated, the diagnostics and operations of the quantum long-range qubit coupling system 100 can be performed at any suitable interval to thereby facilitate the frequency space mapping of one or more of the qubits 217. As indicated, a suitable interval can be between execution of quantum jobs and/or at a defined and uniform interval, such as every 6 hours, every 3 hours, every 1 hour and/or any other suitable interval. The diagnostic processes to be discussed can be performed on any number, one or more, of the qubits 217 of the quantum logic circuit 218 to gain a better understanding of frequency space about the qubit frequencies of these qubits 217.

Further, the aforementioned description(s) refer(s) to the operation of a single set of diagnostics run on a single qubit. However, employment of the diagnostics can be facilitated, where suitable at one or more qubits at a time of a quantum system. For example, non-neighbor qubits of a qubit logic circuit can be simultaneously measured.

Turning now to the classical system specifically, generally, the classical system 231 can comprise any suitable type of component, machine, device, facility, apparatus and/or instrument that comprises a processor and/or can be capable of effective and/or operative communication with a wired and/or wireless network. All such embodiments are envisioned. For example, the classical system 231 can comprise a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device. Likewise, the classical system 231 can be disposed and/or run at any suitable device, such as, but not limited to a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device.

The classical system 231 can comprise a plurality of components. The components can include a memory 234, processor 236, bus 235, mapping component 232, scheduler component 238, and measurement component 239. It is noted that while the mapping component 232, the scheduler component 238, and the measurement component 239 are shown as being comprised by the classical system 231, in one or more other embodiments, any one or more of these components can be comprised by the quantum long-range qubit coupling system 100 or be external to the at least partially external to the classical system 231.

Generally, the classical system 231 can facilitate receipt of a quantum job request 224 and/or receipt of one or more quantum circuits 250 to be operated on the quantum long-range qubit coupling system 100 relative to the quantum logic circuit 218 of the quantum long-range qubit coupling system 100. The quantum circuits 250 can be mapped to one or more physical qubit layouts 252 by the classical system 231, such as based on the readout data from the quantum long-range qubit coupling system 100 and further based on the use of that readout data by the measurement component 239 of the classical system.

Discussion first turns to the processor 236, memory 234 and bus 235 of the classical system 231. For example, in one or more embodiments, the classical system 231 can comprise the processor 236 (e.g., computer processing unit, microprocessor, classical processor, quantum processor and/or like processor). In one or more embodiments, a component associated with classical system 231, as described herein with or without reference to the one or more figures of the one or more embodiments, can comprise one or more computer and/or machine readable, writable and/or executable components and/or instructions that can be executed by processor 236 to facilitate performance of one or more processes defined by such component(s) and/or instruction(s). In one or more embodiments, the processor 236 can comprise the mapping component 232, scheduler component 238, and measurement component 239.

In one or more embodiments, the classical system 231 can comprise the computer-readable memory 234 that can be operably connected to the processor 236. The memory 234 can store computer-executable instructions that, upon execution by the processor 236, can cause the processor 236 and/or one or more other components of the classical system 231 (e.g., mapping component 232, scheduler component 238, and measurement component 239) to perform one or more actions. In one or more embodiments, the memory 234 can store computer-executable components (e.g., mapping component 232, scheduler component 238, and/or measurement component 239).

The classical system 231 and/or a component thereof as described herein, can be communicatively, electrically, operatively, optically and/or otherwise coupled to one another via a bus 235. Bus 235 can comprise one or more of a memory bus, memory controller, peripheral bus, external bus, local bus, quantum bus and/or another type of bus that can employ one or more bus architectures. One or more of these examples of bus 235 can be employed.

In one or more embodiments, the classical system 231 can be coupled (e.g., communicatively, electrically, operatively, optically and/or like function) to one or more external systems (e.g., a non-illustrated electrical output production system, one or more output targets, an output target controller and/or the like), sources and/or devices (e.g., classical and/or quantum computing devices, communication devices and/or like devices), such as via a network. In one or more embodiments, one or more of the components of the classical system 231 and/or of the non-limiting system 200 can reside in the cloud, and/or can reside locally in a local computing environment (e.g., at a specified location(s)).

In addition to the processor 236 and/or memory 234 described above, the classical system 231 can comprise one or more computer and/or machine readable, writable and/or executable components and/or instructions that, when executed by processor 236, can facilitate performance of one or more operations defined by such component(s) and/or instruction(s).

Turning now to the additional components of the classical system 231 (e.g., the mapping component 232, scheduler component 238, and/or measurement component 239), generally, quantum circuits 250 received and/or obtained by the classical system 231 can be analyzed, such as by one or both of the mapping component 232 and scheduler component 238. Based on information from the quantum long-range qubit coupling system 100, the mapping component 232 can map a quantum circuit 250 to a physical qubit layout 252 of the quantum processor 201 (e.g., of one or more qubits of the quantum logic circuit 218). The scheduler component 238, based on additional information from the quantum long-range qubit coupling system 100 and on the mapping information from the mapping component 232, can schedule execution of the quantum circuits 250 in a queue. The additional information from the quantum long-range qubit coupling system 100 can comprise times for running iterations of quantum circuits, times for diagnostic checks, setup, calibration and/or maintenance, and/or the like.

This mapping can be facilitated based on which one or more qubits 217 can be available for execution absent interruption by a TLS and/or other noise of the frequency space about the qubit frequency and/or about a shifted frequency to which the qubit will be moved during an execution of a quantum program 250.

The following description(s) refer(s) to a single set of operations relative to a single qubit. However, employment of the operations of the classical system 231 can be facilitated, where suitable for one or more qubits at a time of a quantum system. For example, measurements can be taken, and estimations performed relative to one or more qubits at a time and/or relative to one or more time ranges for one or more qubits at a time.

Additional description of functionalities will be further described below with reference to the example embodiments of FIGS. 1, 2, 3A, 3B, 3C, 4, and 5 where repetitive description of like elements and/or processes employed in respective embodiments is omitted for sake of brevity.

In embodiments, FIGS. 1 and 2 illustrate block diagrams of example, non-limiting long-range qubit coupling systems 100 that can address the challenges of minimizing losses associated with long-range coupling qubits in accordance with one or more embodiments described herein. Further, the system 100 can include multi-mode qubits (e.g., one or more tunable coupler qubits). In examples, a multi-mode qubit can be any quantum system that is composed of strongly interacting, anharmonic oscillators. The composite system can be characterized by multiple modes of excitations that have strong longitudinal couplings amongst themselves. For example, the excitation of one mode can strongly shift the transition frequency of another).

Figure 3C:
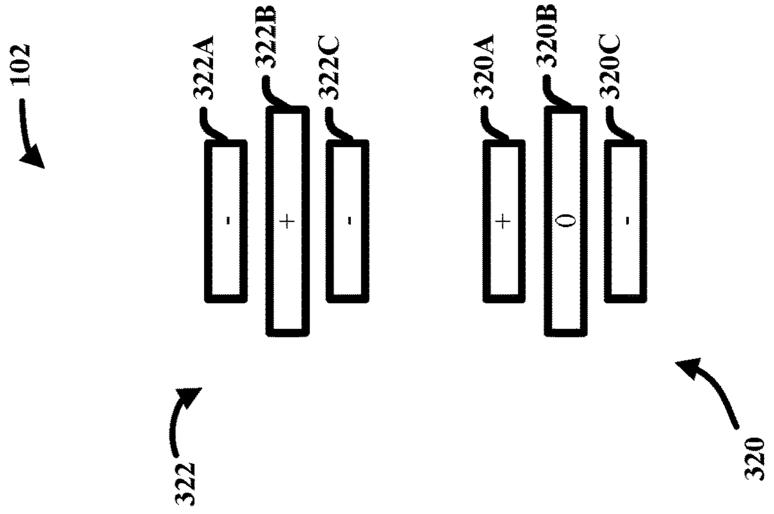
FIG. 3C illustrates a mode structure diagram of an example, non-limiting tunable coupler qubit implemented in long-range coupling qubits in a quantum computing device with energy loss protection, in accordance with one or more embodiments described herein.
Figure 3B:
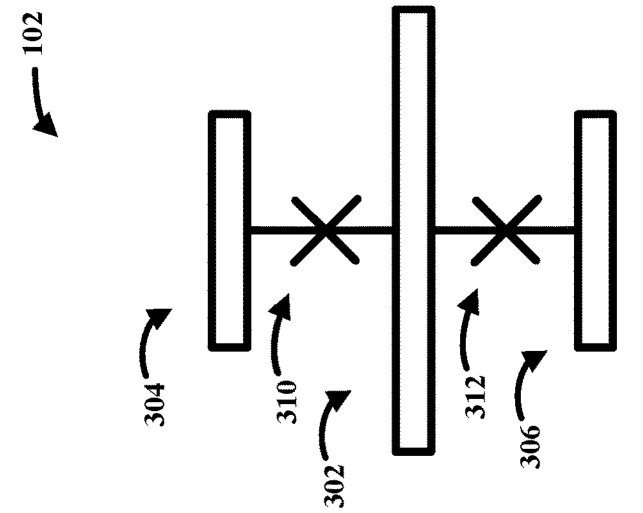
FIG. 3B illustrates a capacitor design diagram of an example, non-limiting tunable coupler qubit implemented in long-range coupling qubits in a quantum computing device with energy loss protection, in accordance with one or more embodiments described herein.
Figure 3A:
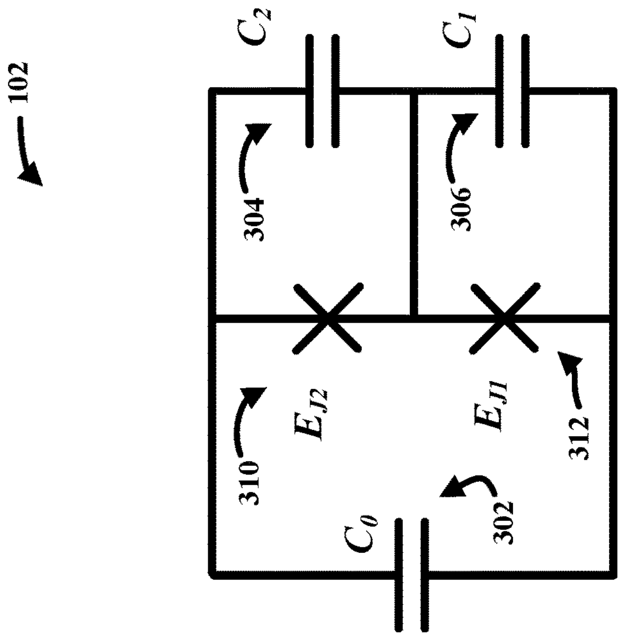
FIG. 3A illustrates a circuit diagram of an example, non-limiting tunable coupler qubit implemented in long-range coupling qubits in a quantum computing device with energy loss protection, in accordance with one or more embodiments described herein.

In embodiments, such as generally illustrated in FIGS. 3A, 3B, and 3C, an example of the multi-mode qubit is a tunable coupler qubit (TCQ) 102 that can be used with the non-limiting long-range qubit coupling system 100. The tunable coupler qubit 102 can include a first capacitor 302, a second capacitor 304, and a third capacitor 306. Further, the tunable coupler qubit 102 can comprise Josephson junctions 310, 312 connected in series with capacitive shunting as shown in FIGS. 3A and 3B. The tunable coupler qubit 102 (e.g. a multi-mode, two-junction superconducting qubit) can include two distinct modes. The tunable coupler qubit can include an A mode 320 and B mode 322 (e.g., as seen in FIG. 3C).

With embodiments, the tunable coupler qubit 102 can include an A mode 320 associated with antisymmetric combinations of excitations associated with the Joseph junctions 310, 312. The tunable coupler qubit 102 can include a first superconducting pad 320A, 322A, a second superconducting pad 320B, 322B, and a third superconducting pad 320C, 322C. Further, while the A mode of the tunable coupler qubit 102 can be excited, the second superconducting pad 320B can be in a ground state (e.g., denoted by "0" in FIG. 3C). In contrast, one of the first superconducting pad 320A and the second superconducting pad 320C can have a positive electrical charge state (e.g., denoted by "+" in FIG. 3C). Where the first superconducting pad 320A has a positive electrical charge (e.g., denoted by "+" in FIG. 3C), the third superconducting pad 320C can have a negative electrical charge (e.g., denoted by "−" in FIG. 3C). Where the third superconducting pad 320C has a positive electrical charge, the first superconducting pad 320A can have a negative electrical charge. Thus, while the A mode is excited, the first superconducting pad 320A and the third superconducting pad 320C can experience excess accumulation of opposite electrical charges, while the second superconducting pad 320B can experience no net electrical charge accumulation.

With embodiments, the tunable coupler qubit 102 can include a B mode 322 associated with symmetric combinations of excitations associated with the Joseph junctions 310, 312. Repetitive description of like elements employed in other embodiments described herein is omitted for the sake of brevity. As shown in FIG. 3C, while the B mode 322 is excited, the second superconducting pad 322B can be electrically charged. For example, the first superconducting pad 322A and the third superconducting pad 322C can have excess accumulations of like electrical charges; thereby, the second superconducting pad 322B can achieve a net electrical charge opposite that of the first superconducting pad 322A and the third superconducting pad 322C. For instance, where the first superconducting pad 322A and the third superconducting pad 322C have a negative electrical charge (e.g., denoted by "−" in FIG. 3C), the second superconducting pad 322B can have a net positive electrical charge (e.g., denoted by "+" in FIG. 3C). In another instance, where the first superconducting pad 322A and the third superconducting pad 322C have a positive electrical charge, the second superconducting pad 322B can have a net negative electrical charge.

In embodiments, the B mode 320 of the tunable coupler qubit 102 can include a frequency that is higher than the alternative A mode of the tunable coupler qubit 102. The B mode 322 of the tunable coupler qubit 102 can be considered as the dark mode because the B mode does not include a net dipole moment.

Figure 4:
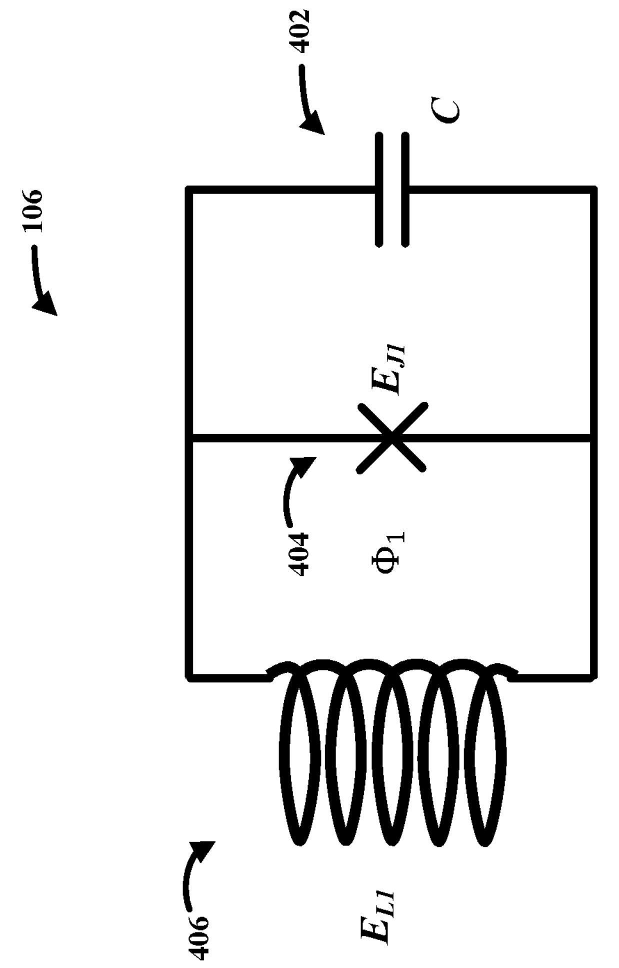
FIG. 4 illustrates a circuit diagram of an example, non-limiting fluxonium qubit implemented in long-range coupling qubits in a quantum computing device with energy loss protection, in accordance with one or more embodiments described herein.

With embodiments, such as generally illustrated in FIG. 4, an example of the fluxonium qubit 106 is shown that can be used with the non-limiting long-range qubit coupling system 100. The fluxonium qubit 106 can include a Josephson junction 404 shunted by a capacitor 402 and an inductor 406 (e.g., a superinductor). In embodiments, the capacitor 402, the Josephson junction 404 and the inductor 406 can be connected in parallel. The capacitor 402 can include a relatively small value for capacitance (e.g., about 20 μF or less). Typically, Josephson junctions 404 in this manner can be implemented in super-inductive circuits as a long chain of Josephson junctions 404.

For example and without limitation, the non-limiting long-range qubit coupling system 100 can operate in a regime where the inductor 406 and the Josephson junction 404 form a loop. The resulting inductive shunt can eliminate the qubit's offset charge and the large inductance value can suppress sensitivity to flux noise. The fluxonium qubit 106 can be tuned by threading an external magnetic flux through the circuit loop. Further, an external magnetic field can be applied to the loop so that the loop encloses half of the magnetic flux quantum, where $\Phi_1=\frac{1}{2}\Phi_0$. Such magnetic field can push down the transition frequency for the first excited state. When the inductor 406 and the Josephson junction 404 enclose half of the magnetic flux quantum, the T1 and T2 coherence times of the fluxonium qubit 106 can be maximized. The fluxonium qubit 106 can support two types of modes. For example and without limitation, the fluxonium qubit 106 can support low frequency fluxon modes associated with circulating currents through the inductor 406 and the Josephson junction 404. Additionally, the fluxonium qubit 106 can support high frequency plasmon modes associated with oscillating charge across the capacitor 402.

Figure 5:
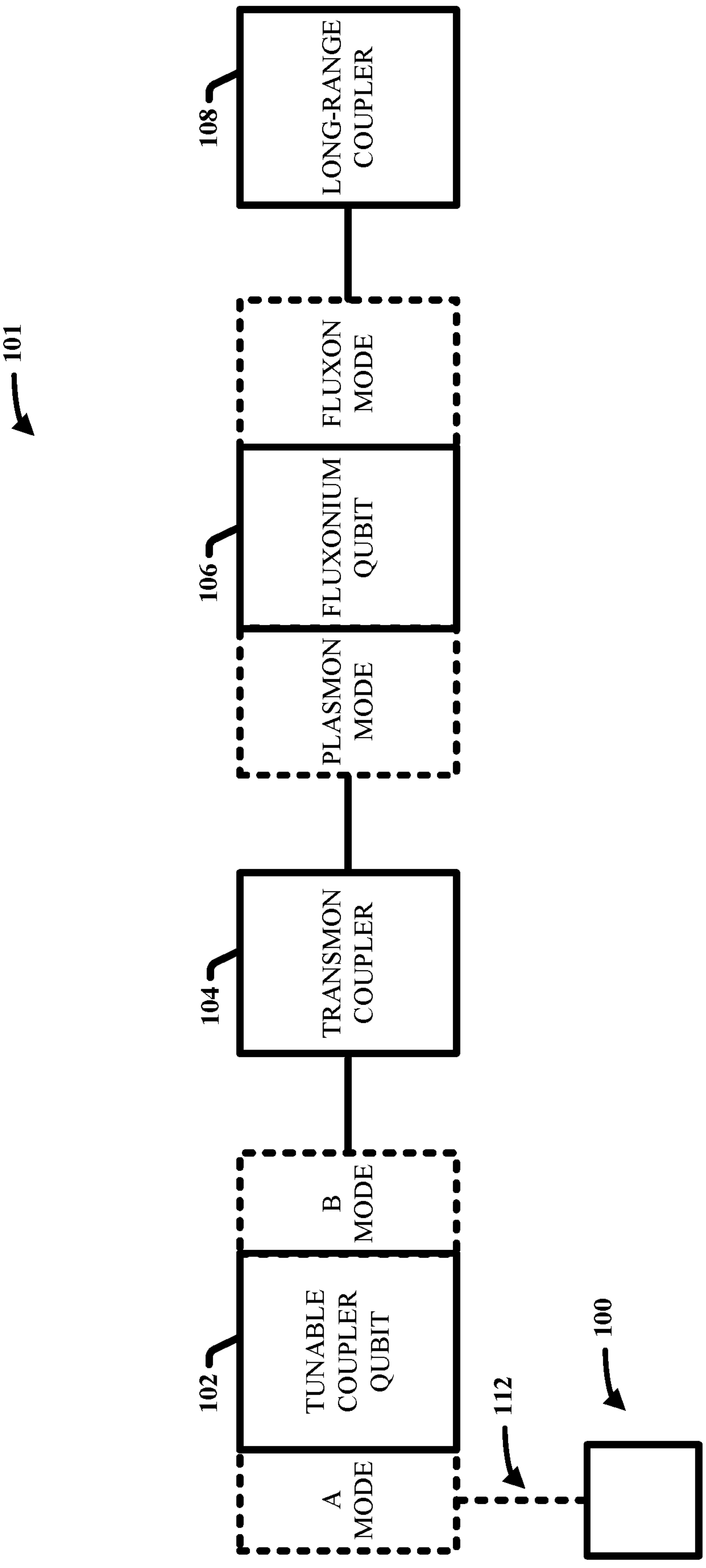
FIG. 5 illustrates a block diagram of an example, non-limiting system that can facilitate long-range coupling qubits in a quantum computing device with energy loss protection, in accordance with one or more embodiments described herein.

Turning now to FIG. 5, which generally demonstrates connections between the components of the non-limiting long-range qubit coupling system 100. In embodiments, the long-range coupler 108 can be selectively coupled to the fluxon mode of the fluxonium qubit 106. In examples the long-range coupler 108 can be one or more of a variety of bus (e.g., a coplanar wave guide, coaxial cable, etc.) Additionally, the long-range coupler 108 can be inductively coupled to the inductor of the fluxonium qubit 106. The inductive coupling between the fluxonium qubit 106 and the long-range coupler 108 can facilitate suppression of the capacitive coupling between the long-range coupler 108 and any other qubits present in the system 100; thus, reducing energy loss of the system 100. Various qubits of the system 100 can interact with other qubits via the long-range coupler 108 and can induce capacitive interactions between the qubits. Such loss can be minimized and/or reduced via inductive coupling the fluxonium qubit 106 to the long-range coupler 108.

In examples, the fluxonium qubit 106 can be selectively coupled to the tunable coupler qubit 102 via the transmon coupler 104. Further, the transmon coupler 104 can be selectively coupled to the plasmon mode of the fluxonium qubit 106 (see, e.g., FIG. 5). The transmon coupler 104 can be additionally selectively coupled to the B mode of the tunable coupler qubit 102. The non-limiting long-range qubit coupling system can entangle the tunable coupler qubit to the fluxonium qubit.

With embodiments, the long-range qubit coupling system 100 can include driving the transmon coupler 104 near resonance in order to entangle the A modes of the tunable coupler qubit 102 to the fluxon mode of the fluxonium qubit 106. The system 100 can facilitate entangling the fluxon mode of the fluxonium qubit 106 in one or more of a variety of manners; for example and without limitation, by driving a cross-resonance gate across the long-range coupler 108. In such examples, a microwave activated two-qubit gate scheme based on selective darkening of a transition can facilitate such entanglement of fluxon modes.

In other embodiments, the system 100 can facilitate entangling the fluxon mode of the fluxonium qubit 106 by changing the flux bias to tune the fluxon mode to be in resonance with a mode of the long-range coupler 108. Microwave photons and phonons can be used to couple superconducting qubits of the system 100. In examples, adiabatic protocols can overcome channel loss by transferring quantum states without populating the associated lossy communication channel. The tunable coupling between each qubit and the communication channel can be controlled via a galvanically-connected variable coupling π-bridge. Further, a dc flux-bias line can afford flux control of each coupler by changing its Joseph junction inductance. However, changes in the coupler junction inductance induces a sympathetic frequency shift in the qubit connected to the associated coupler, as the inductance of the qubit can be modified as well. Changes in the coupler junction inductance also shift the transmission line frequency. Such frequency shifts and coupling strengths can be calibrated in the adiabatic transfer process. Further, this ensures that the qubits and the channel mode remain in frequency resonance during the transfer, and that the couplings vary precisely according to the desired sine and cosine forms.

With embodiments, the A mode of the tunable coupler qubit 102 can be coupled with or connected to one or more of variety of other qubits (e.g., other fluxonium qubits) connected with the system 100. With examples, the long-range coupler 108 can be connected with one or more other quantum components, such as other tunable coupler qubits 202, transmon couplers 204, and fluxonium qubits 106 (e.g., as generally illustrated in FIG. 6).

Figure 6:
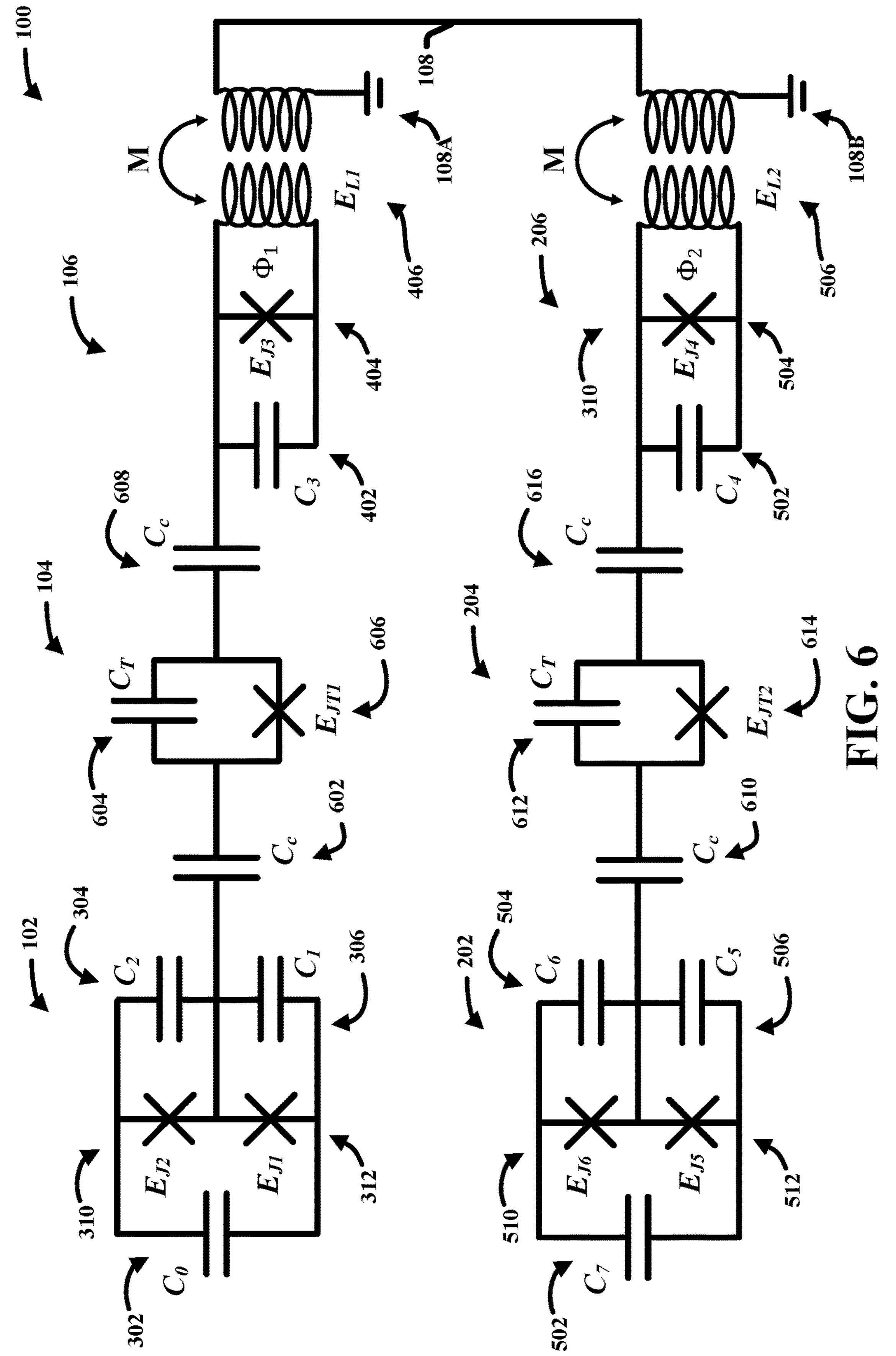
FIG. 6 illustrates a circuit diagram of an example, non-limiting system that can facilitate long-range coupling qubits in a quantum computing device with energy loss protection, in accordance with one or more embodiments described herein.

In examples, such as illustrated in FIG. 6, the non-limiting long-range qubit coupling system 100 can selectively connect a first tunable coupler qubit 102, a first transmon coupler 104, and a first fluxonium qubit 106 with a second tunable coupler qubit 202, a second transmon coupler 204, and a second fluxonium qubit 206 via the long-range coupler 108. Long-range coupler 108 can be grounded (e.g., via ground elements 108A and 108B) at ends of the coupler such that the fluxonium qubit 106 is connected to the long-range coupler 108 through inductive coupling. Inductive coupling and grounding the long-range coupler can limit the ability of the long-range coupler 108 to have capacitive coupling to other quantum components of the non-limiting long-range qubit coupling system 100 (resulting in energy loss suppression via the long-range coupler 108).

With embodiments, the long-range coupler 108 can be inductively coupled to the inductor 406 of the first fluxonium qubit 106. Additionally, the long-range coupler 108 can be inductively coupled to an inductor 506 of the second fluxonium qubit 206 (e.g., in a similar manner). The capacitor 402 of the first fluxonium qubit 106 can be selectively coupled to the first transmon coupler 104 via a capacitor 608. Similarly, a capacitor 502 of the second fluxonium qubit 206 can be selectively coupled to the second transmon coupler 204 via a capacitor 616. Further, the first and second transmon couplers 104, 204 can include a capacitor 604, 612 and a Josephson junction 606, 614 connected in parallel. The first and second transmon couplers 104, 204 can be selectively coupled with the B mode of the first and second tunable coupler qubits 102, 202 via capacitors 602, 610. For example, capacitors 602, 610 can be connected between a middle pad of the first and second tunable coupler qubits 102, 202 and one of the pads of the first and second transmon couplers 104, 204.

Further, due to inductive coupling between the long-range coupler 108 and the first and second fluxonium qubits 106, 206, capacitive coupling between the fluxonium qubits 106, 206 can be at least partially suppressed. The inefficient effect of utilizing a long-range coupler 108 can be reduced and/or minimized via the circuit structure of FIG. 6 and the accompanying description. Additionally, with grounded ends of the long-range coupler 108 and inductive coupling between the long-range coupler 108 and the fluxon mode of the fluxonium qubits 106, 206, the long-range coupler 108 includes reduced/negligible/zero-value long-range capacitive coupling to the remainder of the quantum long-range qubit coupling system 100 or quantum processor 101 (e.g., as indicated by dashed arrows 112 in FIGS. 1 and 5). Fluxon modes of the fluxonium qubits 106, 206 can lose energy to the long-range coupler 108 via the inductive coupling; however, the A modes of the tunable coupler qubits 102, 202 can be unable to exchange energy with the fluxonium qubits 106, 206 due to the selective coupling; thus, suppressing energy loss.

Figure 7A:
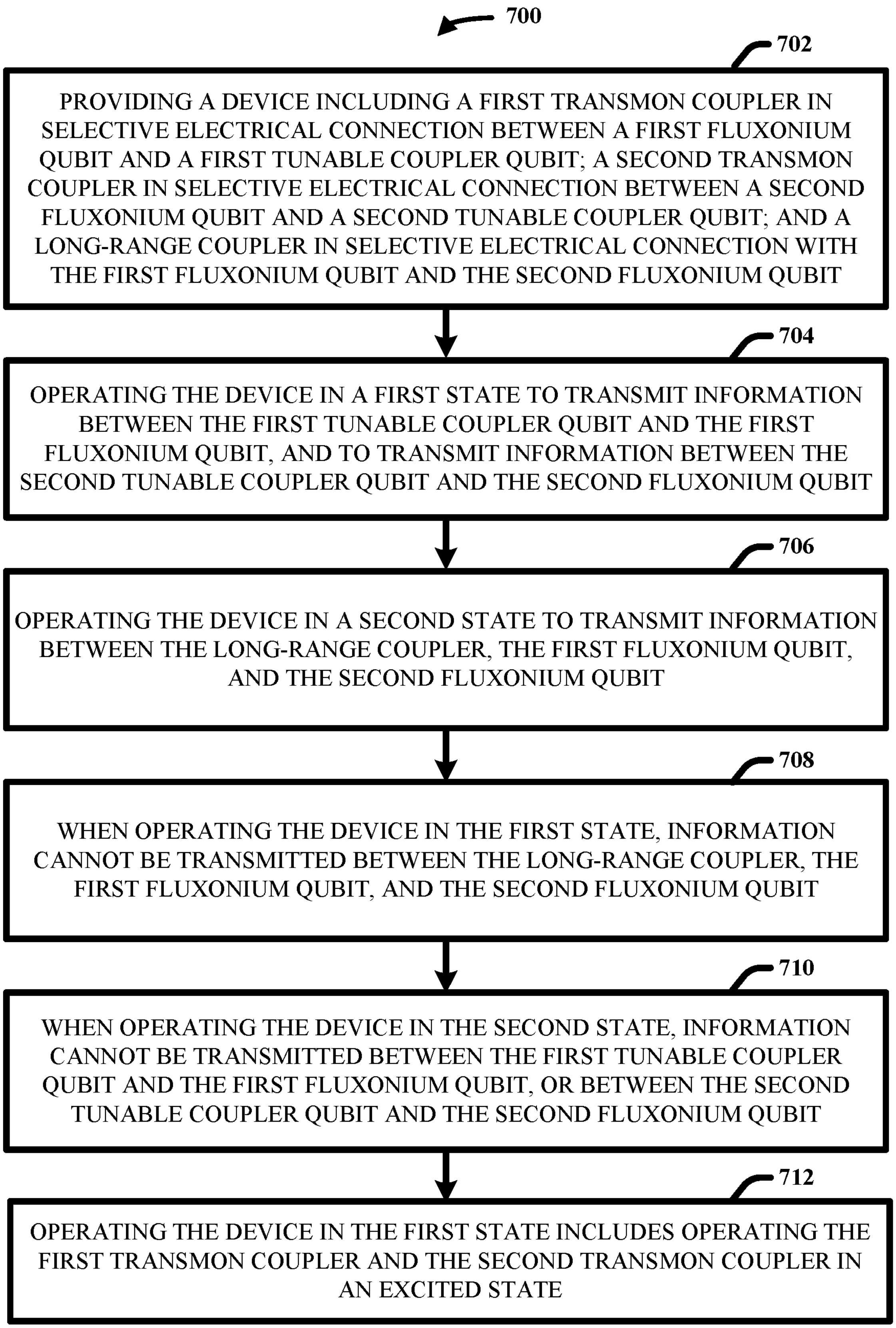
FIG. 7A illustrates a flow diagram of an example, non-limiting computer implemented method that can facilitate long-range coupling qubits in a quantum computing device with energy loss protection, in accordance with one or more embodiments described herein.
Figure 7B:
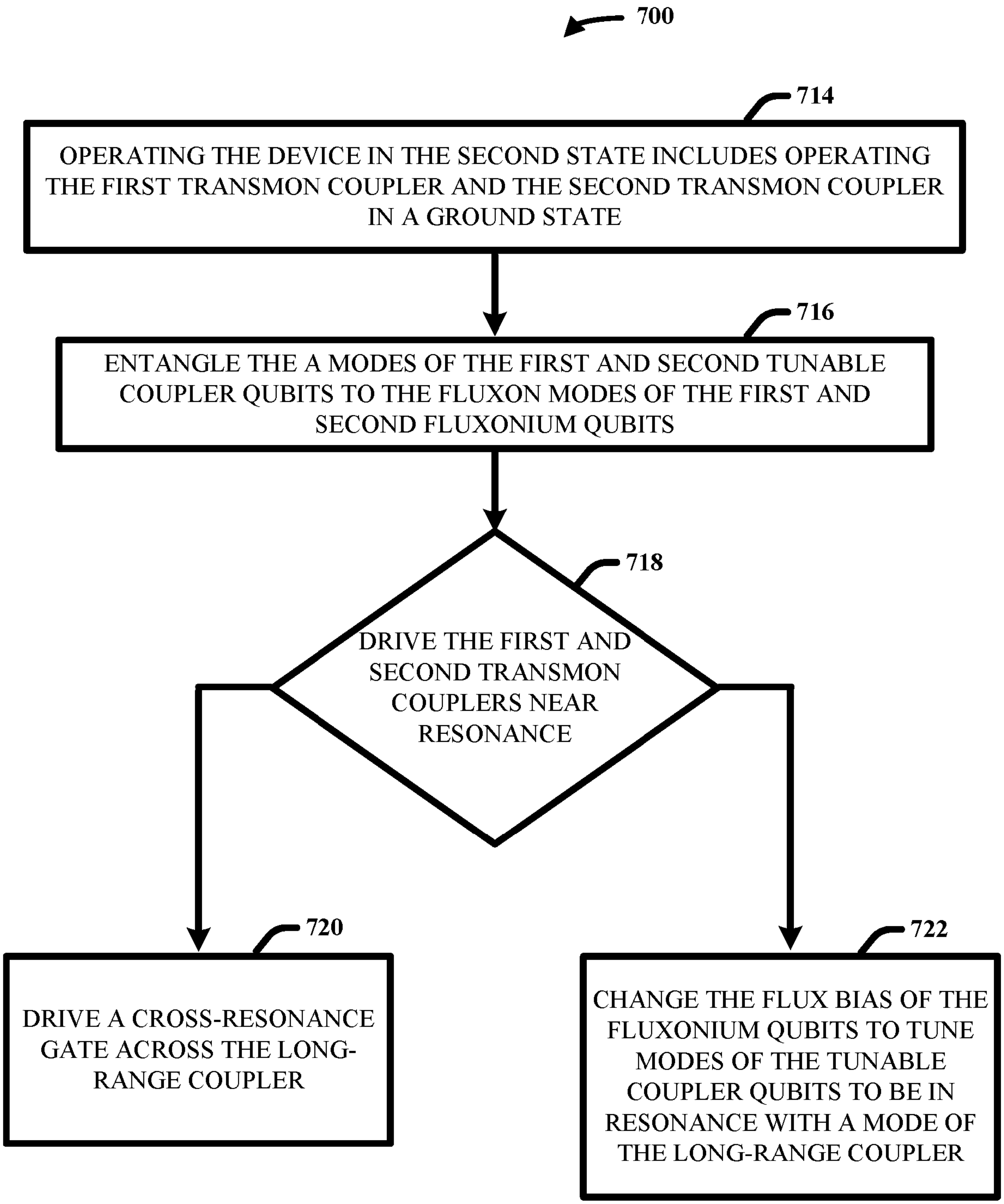
FIG. 7B illustrates a continued flow diagram of an example, non-limiting computer implemented method that can facilitate long-range coupling qubits in a quantum computing device with energy loss protection, in accordance with one or more embodiments described herein.

With embodiments, FIGS. 7A and 7B illustrate a methodology in accordance with one or more embodiments of the subject application. While, for purposes of simplicity of explanation, the methodology shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

In embodiments as generally shown by the flow diagram of FIG. 7A, the example method 700 can facilitate performing operations across a long-range qubit coupling device with energy loss protection. For example and without limitation, the method 700 can comprise providing a device including a first transmon coupler 104 that can be in selective electrical connection between a first fluxonium qubit 106 and a first tunable coupler qubit 102; a second transmon coupler 204 that can be in selective electrical connection between a second fluxonium qubit 206 and a second tunable coupler qubit 202; and a long-range coupler 108 that can be in selective electrical connection with the first fluxonium qubit 106 and the second fluxonium qubit 206 (step 702). The long-range coupler 108 can be inductively connected (e.g., selectively) to the first fluxonium qubit 106 and the second fluxonium qubit 206. Such inductive coupling between the long-range coupler 108 and the fluxonium qubits 106, 206 can facilitate suppression of the capacitive coupling of long-range coupler 108 and the fluxonium qubits 106, 206. Further, the inductive coupling helps to reduce energy loss due to the long-range capacitive network of the system 100. The method 700 can further comprise operating the device in a first state to transmit information between the first tunable coupler qubit 102 and the first fluxonium qubit 106, and to transmit information between the second tunable coupler qubit 202 and the second fluxonium qubit 206 (step 704). Additionally, the method 700 can further comprise operating the device in a second state to transmit information between the long-range coupler 108, the first fluxonium qubit 106, and the second fluxonium qubit 206 (step 706). The method of performing operations across a long-range coupling device with energy loss protection 700 can comprise that when operating the device in the first state, information cannot be transmitted between the long-range coupler 108, the first fluxonium qubit 106, and the second fluxonium qubit 206 (step 708). By grounding the ends of the long-range coupler 108 and inductively coupling to the fluxon mode of the first fluxonium qubit 106 and the fluxon mode of the second fluxonium qubit 206, the long-range bus 108 cannot include long-range capacitive coupling to the rest of the quantum long-range qubit coupling system 100 resulting in suppressed energy loss via the long-range coupler 108.

With embodiments, the method 700 can additionally comprise that when operating the device in the second state, information cannot be transmitted between the first tunable coupler qubit 102 and the first fluxonium qubit 106, and/or between the second tunable coupler qubit 202 and the second fluxonium qubit 206 (step 710) (e.g., in instances where information cannot be transmitted, the transmission of noise can be limited in a similar manner). Further, operating the device in the first state can include operating the first transmon coupler 104 and the second transmon coupler 204 in an excited state (step 712). Operating the device in the second state can include operating the first transmon coupler 104 and the second transmon coupler 204 in a ground state (step 714).

In embodiments, the method of performing operations across a long-range coupling device with energy loss protection 700 can comprise entangling the A modes of the first and second tunable coupler qubits 102, 202 to the fluxon modes of the first and second fluxonium qubits 106, 206 (step 716). Further, the method 700 can include driving the first transmon coupler 104 and the second transmon coupler 204 near resonance to entangle the tunable coupler qubits 102, 202 to the fluxonium qubits 106, 206 (step 718). The system 100 can entangle the tunable coupler qubits 102, 202 and the fluxonium qubits 106, 206 in one or more of a variety of manners. For example and without limitation, the method 700 can entangle such components to mitigate energy loss of the system 100 by driving a cross-resonance gate across the long-range coupler (step 720). Additionally or alternatively, the method 700 can entangle such components by changing the flux bias of the fluxonium qubits 106, 206 to tune modes of the tunable coupler qubits 102, 202 to be in resonance with the a mode of the long-range coupler 108 (step 722).

Turning next to FIG. 8, a detailed description is provided of additional context for the one or more embodiments described herein at FIGS. 1-7B.

FIG. 8 and the following discussion are intended to provide a general description of a suitable computing environment 800 in which one or more embodiments described herein at FIGS. 1-7B can be implemented. For example, various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 800 contains an example of an environment for the execution of at least some of the computer code involved in performing the inventive methods, such as long-range qubit coupling code block 900. In addition to block 900, computing environment 800 includes, for example, computer 801, wide area network (WAN) 802, end user device (EUD) 703, remote server 804, public cloud 805, and private cloud 806. In this embodiment, computer 801 includes processor set 810 (including processing circuitry 820 and cache 821), communication fabric 811, volatile memory 812, persistent storage 813 (including operating system 822 and block 900, as identified above), peripheral device set 814 (including user interface (UI), device set 823, storage 824, and Internet of Things (IoT) sensor set 825), and network module 815. Remote server 804 includes remote database 830. Public cloud 805 includes gateway 840, cloud orchestration module 841, host physical machine set 842, virtual machine set 843, and container set 844.

COMPUTER 801 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 830. As is well understood in the art of computer technology, and depending upon the technology, performance of a computer-implemented method may be distributed among multiple computers and/or between multiple locations. On the other hand, in this presentation of computing environment 800, detailed discussion is focused on a single computer, specifically computer 801, to keep the presentation as simple as possible. Computer 801 may be located in a cloud, even though it is not shown in a cloud in FIG. 8. On the other hand, computer 801 is not required to be in a cloud except to any extent as may be affirmatively indicated.

PROCESSOR SET 810 includes one, or more, computer processors of any type now known or to be developed in the future. Processing circuitry 820 may be distributed over multiple packages, for example, multiple, coordinated integrated circuit chips. Processing circuitry 820 may implement multiple processor threads and/or multiple processor cores. Cache 821 is memory that is located in the processor chip package(s) and is typically used for data or code that should be available for rapid access by the threads or cores running on processor set 810. Cache memories are typically organized into multiple levels depending upon relative proximity to the processing circuitry. Alternatively, some, or all, of the cache for the processor set may be located "off chip." In some computing environments, processor set 810 may be designed for working with qubits and performing quantum computing.

Computer readable program instructions are typically loaded onto computer 801 to cause a series of operational steps to be performed by processor set 810 of computer 801 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 821 and the other storage media discussed below. The program instructions, and associated data, are accessed by processor set 810 to control and direct performance of the inventive methods. In computing environment 800, at least some of the instructions for performing the inventive methods may be stored in block 900 in persistent storage 813.

COMMUNICATION FABRIC 811 is the signal conduction paths that allow the various components of computer 801 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 812 is any type of volatile memory now known or to be developed in the future. Examples include dynamic type random access memory (RAM) or static type RAM. Typically, the volatile memory is characterized by random access, but this is not required unless affirmatively indicated. In computer 801, the volatile memory 812 is located in a single package and is internal to computer 801, but, alternatively or additionally, the volatile memory may be distributed over multiple packages and/or located externally with respect to computer 801.

PERSISTENT STORAGE 813 is any form of non-volatile storage for computers that is now known or to be developed in the future. The non-volatility of this storage means that the stored data is maintained regardless of whether power is being supplied to computer 801 and/or directly to persistent storage 813. Persistent storage 813 may be a read only memory (ROM), but typically at least a portion of the persistent storage allows writing of data, deletion of data and re-writing of data. Some familiar forms of persistent storage include magnetic disks and solid state storage devices. Operating system 822 may take several forms, such as various known proprietary operating systems or open source Portable Operating System Interface type operating systems that employ a kernel. The code included in block 900 typically includes at least some of the computer code involved in performing the inventive methods.

PERIPHERAL DEVICE SET 814 includes the set of peripheral devices of computer 801. Data communication connections between the peripheral devices and the other components of computer 801 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 823 may include components such as a display screen, speaker, microphone, wearable devices (such as goggles and smart watches), keyboard, mouse, printer, touchpad, game controllers, and haptic devices. Storage 824 is external storage, such as an external hard drive, or insertable storage, such as an SD card. Storage 824 may be persistent and/or volatile. In some embodiments, storage 824 may take the form of a quantum computing storage device for storing data in the form of qubits. In embodiments where computer 801 is required to have a large amount of storage (for example, where computer 801 locally stores and manages a large database) then this storage may be provided by peripheral storage devices designed for storing very large amounts of data, such as a storage area network (SAN) that is shared by multiple, geographically distributed computers. IoT sensor set 825 is made up of sensors that can be used in Internet of Things applications. For example, one sensor may be a thermometer and another sensor may be a motion detector.

NETWORK MODULE 815 is the collection of computer software, hardware, and firmware that allows computer 801 to communicate with other computers through WAN 802. Network module 815 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 815 are performed on the same physical hardware device. In other embodiments (for example, embodiments that utilize software-defined networking (SDN)), the control functions and the forwarding functions of network module 815 are performed on physically separate devices, such that the control functions manage several different network hardware devices. Computer readable program instructions for performing the inventive methods can typically be downloaded to computer 801 from an external computer or external storage device through a network adapter card or network interface included in network module 815.

WAN 802 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 803 is any computer system that is used and controlled by an end user (for example, a customer of an enterprise that operates computer 801), and may take any of the forms discussed above in connection with computer 801. EUD 803 typically receives helpful and useful data from the operations of computer 801. For example, in a hypothetical case where computer 801 is designed to provide a recommendation to an end user, this recommendation would typically be communicated from network module 815 of computer 801 through WAN 802 to EUD 803. In this way, EUD 803 can display, or otherwise present, the recommendation to an end user. In some embodiments, EUD 803 may be a client device, such as thin client, heavy client, mainframe computer, desktop computer and so on.

REMOTE SERVER 804 is any computer system that serves at least some data and/or functionality to computer 801. Remote server 804 may be controlled and used by the same entity that operates computer 801. Remote server 804 represents the machine(s) that collect and store helpful and useful data for use by other computers, such as computer 801. For example, in a hypothetical case where computer 801 is designed and programmed to provide a recommendation based on historical data, then this historical data may be provided to computer 801 from remote database 830 of remote server 804.

PUBLIC CLOUD 805 is any computer system available for use by multiple entities that provides on-demand availability of computer system resources and/or other computer capabilities, especially data storage (cloud storage) and computing power, without direct active management by the scale. The direct and active management of the computing resources of public cloud 805 is performed by the computer hardware and/or software of cloud orchestration module 841. The computing resources provided by public cloud 805 are typically implemented by virtual computing environments that run on various computers making up the computers of host physical machine set 842, which is the universe of physical computers in and/or available to public cloud 805. The virtual computing environments (VCEs) typically take the form of virtual machines from virtual machine set 843 and/or containers from container set 844. It is understood that these VCEs may be stored as images and may be transferred among and between the various physical machine hosts, either as images or after instantiation of the VCE. Cloud orchestration module 841 manages the transfer and storage of images, deploys new instantiations of VCEs and manages active instantiations of VCE deployments. Gateway 840 is the collection of computer software, hardware, and firmware that allows public cloud 805 to communicate through WAN 802.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 806 is similar to public cloud 805, except that the computing resources are only available for use by a single enterprise. While private cloud 806 is depicted as being in communication with WAN 802, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 805 and private cloud 806 are both part of a larger hybrid cloud.

The embodiments described herein can be directed to one or more of a system, a method, an apparatus or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network or a wireless network. The network can comprise copper transmission cables, optical transmission fibers, wireless transmission, routers, firewalls, switches, gateway computers or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, or source code or object code written in any combination of one or more programming languages, including an object oriented programming language such as Smalltalk, C++ or the like, or procedural programming languages, such as the "C" programming language or similar programming languages. The computer readable program instructions can execute entirely on the user's computer, partly on the user's computer, as a stand-alone software package, partly on the user's computer or partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In one or more embodiments, electronic circuitry including, for example, programmable logic circuitry, field-programmable gate arrays (FPGA) or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described herein with reference to flowchart illustrations or block diagrams of methods, apparatus (systems), and devices according to one or more embodiments described herein. It will be understood that each block of the flowchart illustrations or block diagrams, and combinations of blocks in the flowchart illustrations or block diagrams, can be implemented by computer readable program instructions. These computer readable program instructions can be provided to a processor of a general purpose computer, special purpose computer or other programmable data processing apparatus to produce a machine, such that the instructions, which execute via the processor of the computer or other programmable data processing apparatus, create means for implementing the functions/acts specified in the flowchart or block diagram block or blocks. These computer readable program instructions can also be stored in a computer readable storage medium that can direct a computer, a programmable data processing apparatus or other devices to function in a particular manner, such that the computer readable storage medium having instructions stored therein comprises an article of manufacture including instructions which implement aspects of the function/act specified in the flowchart or block diagram block or blocks. The computer readable program instructions can also be loaded onto a computer, other programmable data processing apparatus or other device to cause a series of operational acts to be performed on the computer, other programmable apparatus or other device to produce a computer implemented process, such that the instructions which execute on the computer, other programmable apparatus or other device implement the functions/acts specified in the flowchart or block diagram block or blocks.

The flowcharts and block diagrams in the figures illustrate the architecture, functionality, and operation of possible implementations of systems, computer-implementable methods or computer program products according to one or more embodiments described herein. In this regard, each block in the flowchart or block diagrams can represent a module, segment or portion of instructions, which comprises one or more executable instructions for implementing the specified logical function(s). In one or more alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer or computers, those skilled in the art will recognize that the one or more embodiments herein also can be implemented in combination with other program modules. Generally, program modules include routines, programs, components, data structures or the like that perform particular tasks or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics or the like. The illustrated aspects can also be practiced in distributed computing environments in which tasks are performed by remote processing devices that are linked through a communications network. However, some, if not all aspects of the one or more embodiments can be practiced on stand-alone computers. In a distributed computing environment, program modules can be located in both local and remote memory storage devices.

As used in this application, the terms "component," "system," "platform," "interface," or the like, can refer to or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program or a computer. By way of illustration, both an application running on a server and the server can be a component. One or more components can reside within a process or thread of execution and a component can be localized on one computer or distributed between two or more computers. In another example, respective components can execute from various computer readable media having various data structures stored thereon. The components can communicate via local or remote processes such as in accordance with a signal having one or more data packets (e.g., data from one component interacting with another component in a local system, distributed system or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, where the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) or Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing the one or more embodiments, but one of ordinary skill in the art can recognize that many further combinations and permutations of the one or more embodiments are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the one or more embodiments provided herein have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:

a first transmon coupler capable of selectively coupling a first tunable coupler qubit to a first fluxonium qubit, wherein the first transmon coupler is coupled to a first B mode of the first tunable coupler qubit;

a second transmon coupler capable of selectively coupling a second tunable coupler qubit to a second fluxonium qubit, wherein the second transmon coupler is coupled to a second B mode of the second tunable coupler qubit; and a long-range coupler capable of selectively coupling the first fluxonium qubit to the second fluxonium qubit.

2. The system of claim 1, wherein the first transmon coupler is coupled to a first plasmon mode of the first fluxonium qubit, and the second transmon coupler is coupled to a second plasmon mode of the second fluxonium qubit.

3. The system of claim 2, wherein the long-range coupler is inductively coupled to a first inductor of the first fluxonium qubit and to a second inductor of the second fluxonium qubit.

4. The system of claim 3, wherein the system includes a first state in which information cannot be transmitted between the first fluxonium qubit, the second fluxonium qubit, and the long-range coupler; and a second state in which information cannot be transmitted between the first tunable coupler qubit and the first fluxonium qubit, and between the second tunable coupler qubit and the second transmon coupler.

5. The system of claim 4, wherein in the first state, the long-range coupler is not in selective electrical connection with the first fluxonium qubit or the second fluxonium qubit; the first B mode of the first tunable coupler qubit is in electrical connection with the first plasmon mode of the first fluxonium qubit via the first transmon coupler; and the second B mode of the second tunable coupler qubit is in electrical connection with the second plasmon mode of the second fluxonium qubit.

6. The system of claim 4, wherein the first tunable coupler qubit and the second tunable coupler qubit operate in a ground state that limits electrical connection of the long-range coupler to the first tunable coupler qubit and the second tunable coupler qubit when the system is in the first state.

7. The system of claim 4, wherein in the second state, the long-range coupler is in electrical connection with the first fluxonium qubit and the second fluxonium qubit; and the first tunable coupler qubit and the second tunable coupler qubit are not in electrical connection with the first fluxonium qubit and the second fluxonium qubit.

8. The system of claim 7, wherein the first tunable coupler qubit and the second tunable coupler qubit operate in an excited state when the system is in the second state to facilitate connection between the first tunable coupler qubit and the first fluxonium qubit, and between the second tunable coupler qubit and the second fluxonium qubit.

9. The system of claim 8, wherein the first A mode of the first tunable coupler qubit and the second A mode of the second tunable coupler qubit are entangled with fluxon modes of the first fluxonium qubit and the second fluxonium qubit by driving the first tunable coupler qubit and the second tunable coupler qubit near resonance.

10. A method of performing operations across a long-range qubit coupling device with energy loss protection, the method comprising:

- providing a device including a first transmon coupler in selective electrical connection between a first fluxonium qubit and a first tunable coupler qubit; a second transmon coupler in selective electrical connection between a second fluxonium qubit and a second tunable coupler qubit; and a long-range coupler in selective electrical connection with the first fluxonium qubit and the second fluxonium qubit;
- operating the device in a first state to transmit information between the first tunable coupler qubit and the first fluxonium qubit, and to transmit information between the second tunable coupler qubit and the second fluxonium qubit; and
- operating the device in a second state to transmit information between the long-range coupler, the first fluxonium qubit, and the second fluxonium qubit.

11. The method of performing operations across a long-range qubit coupling device according to claim 10, wherein when operating the device in the first state, information cannot be transmitted between the long-range coupler, the first fluxonium qubit, and the second fluxonium qubit.

12. The method of performing operations across a long-range qubit coupling device according to claim 11, wherein when operating the device in the second state, information cannot be transmitted between the first tunable coupler qubit and the first fluxonium qubit, or between the second tunable coupler qubit and the second fluxonium qubit.

13. The method of performing operations across a long-range qubit coupling device according to claim 10, wherein operating the device in the first state includes operating the first transmon coupler and the second transmon coupler in an excited state.

14. The method of performing operations across a long-range qubit coupling device according to claim 13, wherein operating the device in the second state includes operating the first transmon coupler and the second transmon coupler in a ground state.

15. The method of performing operations across a long-range qubit coupling device according to claim 14, further comprising:

- driving the first transmon coupler and the second transmon coupler near resonance to entangle the A modes of the first tunable coupler qubit and the second tunable coupler qubit to a fluxon mode of the first fluxonium qubit and the second fluxonium qubit.

16. A device comprising:

- a first fluxonium qubit coupled to a first tunable coupler qubit by a first transmon coupler;
- a second fluxonium qubit coupled to a second tunable coupler qubit by a second transmon coupler; and
- a long-range coupler coupled to the first fluxonium qubit and the second fluxonium qubit;
- wherein the first tunable coupler qubit includes a first B mode and the second tunable coupler qubit includes a second B mode, and the first B mode of the first tunable coupler qubit and the second B mode of the second tunable coupler qubit are coupled to the first transmon coupler and the second transmon coupler.

17. The device of claim 16, wherein the long-range coupler is at least one of a wave guide and coaxial cable.

18. The device of claim 17, wherein the long-range coupler is inductively coupled to a first fluxon mode of the first fluxonium qubit and to a second fluxon mode of the second fluxonium qubit.

19. The device of claim 18, further comprising one or more two-qubit gates connected between a first A mode of the first tunable coupler qubit, a second A mode of the second tunable coupler qubit, and one or more other qubits; wherein the first A mode of the first tunable coupler qubit and the second A mode of the second tunable coupler qubit are electrically connected with the one or more other qubits.

20. The device of claim 18, wherein the first tunable coupler qubit and the second tunable coupler qubit operate in a ground state that limits electrical connection of the long-range coupler to the first tunable coupler qubit and the second tunable coupler qubit.

* * * * *